United States Patent [19]
Akram

[11] Patent Number: 5,904,497
[45] Date of Patent: May 18, 1999

[54] METHOD AND APPARATUS FOR SEMICONDUCTOR ASSEMBLY WHICH INCLUDES TESTING OF CHIPS AND REPLACEMENT OF BAD CHIPS PRIOR TO FINAL ASSEMBLY

[75] Inventor: Salman Akram, Boise, Id.

[73] Assignee: Micron Technology, Inc., Boise, Id.

[21] Appl. No.: 08/916,812

[22] Filed: Aug. 22, 1997

[51] Int. Cl.⁶ ............................. H01L 21/60; H01L 21/56
[52] U.S. Cl. ..................... 438/106; 438/109; 257/692; 257/693; 257/678
[58] Field of Search ........................... 438/15, 109, 124, 438/125, 126, 106, 107; 257/684, 692, 693, 678, 687, 698, 774, 786, 788, 792, 779, 701, 704

[56] References Cited

U.S. PATENT DOCUMENTS

| | | |
|---|---|---|
| 5,155,067 | 10/1992 | Wood et al. . |
| 5,241,133 | 8/1993 | Mullen, III et al. . |
| 5,336,649 | 8/1994 | Kinsman et al. . |
| 5,371,328 | 12/1994 | Gutierrez et al. . |
| 5,455,456 | 10/1995 | Newman . |
| 5,468,995 | 11/1995 | Higgins, III . |
| 5,502,333 | 3/1996 | Bertin et al. . |
| 5,557,142 | 9/1996 | Gilmore et al. . |
| 5,663,106 | 9/1997 | Karavakis et al. . |
| 5,693,981 | 12/1997 | Schneider et al. . |
| 5,723,907 | 3/1998 | Akram . |
| 5,750,423 | 5/1998 | Ishii . |

*Primary Examiner*—Charles Bowers
*Assistant Examiner*—Martin Sulsky

[57] ABSTRACT

A semiconductor assembly, and method for forming same, comprises a support such as a printed circuit board (PCB), at least one semiconductor die, and a surface plate manufactured from a material such as ceramic, plastic, silicon, or the like. The semiconductor die is removably attached to the PCB, and an electrical interconnect such as a wire bond electrically couples the PCB and the die. The surface plate is attached to the die and leaves exposed the terminals on the die. The die is burned in and tested. Responsive to the die passing the test, the surface plate is underfilled, for example with a glob top material, to seal the electrical interconnect and its attachment to the PCB and to the die. Responsive to the die failing the test, the die is removed and replaced with another die. Various other embodiments of the invention are described.

20 Claims, 5 Drawing Sheets

5,904,497

METHOD AND APPARATUS FOR SEMICONDUCTOR ASSEMBLY WHICH INCLUDES TESTING OF CHIPS AND REPLACEMENT OF BAD CHIPS PRIOR TO FINAL ASSEMBLY

FIELD OF THE INVENTION

This invention relates to the field of semiconductor assembly, and more particularly to a method and apparatus used to protect a semiconductor die from environmental damage.

BACKGROUND OF THE INVENTION

Electronic packaging technology has undergone repeated transformations and improvements during the past decade, driven by reliability, size, and price considerations. Most packaging methods involve the use of encapsulants to protect a semiconductor die and electrical interconnections such as bond wires from physical damage and ionic contamination prior to the final step of packaging the die.

One type of encapsulated electronic package is made by bonding one (or more) semiconductor die to a substrate such as a printed circuit board (PCB) or other wiring board with an adhesive, and covering the die with an encapsulant. The final packaging step includes encasing the die in a plastic molding to protect the die and fragile wire bonds from possible environmental damage. The encapsulants used to accomplish this are dispensed to form a glob over the die and the electrical interconnections, and are generally known to those skilled in the art as "glob top" encapsulants. The demand for miniaturized circuitry has led to the use of glob top as a preferred assembly method for many types of products, including microprocessor circuitry.

Glob-topping protects the semiconductor die and bonding wires that electrically couple the die to the circuit board or wiring board during manufacture. The encapsulant material and the process of applying the encapsulant are both referred to as glob top. The glob top encapsulant covers the die, portions of the metal circuit pattern on the surface of the die, the bond wires, and portion of the PCB surface. Conventional glob-topping processes rely upon the low viscosity of the encapsulant material at the forming temperature which is dispensed from a plastic syringe having a needle tip. In the glob top process, a dam is formed around the periphery of the die and bond wires to constrain the lateral flow of the encapsulant. The encapsulant material is then dispensed within the perimeter of the dam and gravity is relied upon to form the protective cover for the assembly. The syringe is used both to form the dam structure and dispense the additional glob top inside the dam. The material is dispensed from the syringe in the form of a viscous stream or column in a back and forth pattern until the areas that require protection have been completely covered with the glob top.

Because products are becoming more miniaturized to meet market demands even as integrated circuit die are growing larger with more outputs, the use of glob top material is becoming an attractive method of packaging because of its compact nature. For example, the surface area covered by the glob top material compared to standard encapsulated devices is much smaller. Furthermore, glob top material can induce significant stresses on the die that can lead to cracking.

Semiconductor die are not typically functionally and parametrically tested and burned in prior to assembly to a PCB. If a die that is assembled and glob-topped to a PCB later fails during testing it is difficult or impossible to remove and replace without damaging the PCB or bonding pads on the PCB. To overcome the problem of rework, a replacement (redundant) die is often assembled to the PCB while the nonfunctional die is left in place on the PCB but electrically disabled. Leaving the nonfunctional die in place, however, can defeat the size advantage offered by the glob top assembly as it requires additional space on the PCB and adding redundancy through additional die is rarely cost effective.

An assembly and process that reduces the problems associated with conventional glob top technology would be desirable.

SUMMARY OF THE INVENTION

The present invention provides a new apparatus that reduces problems associated with the manufacture of semiconductor devices, particularly glob top style semiconductor devices. Also disclosed is a method for forming the new apparatus. In accordance with one embodiment of the invention, a semiconductor die is attached to a support such as a printed circuit board (PCB) and terminals on the die are electrically connected with traces on the PCB. A surface plate is attached to the die which protects the die but leaves exposed the terminals on the die. The die is tested and burned in and, if the die passes the test, the terminals and at least a portion of the electrical connection between the die and the PCB is encased in a material such as a glob top material or underfill which may contact the surface plate. In a second embodiment, if the die fails the test after burn in, it can be removed and replaced with another die. If the die passes after burn in and an initial test, but later fails, it can be reworked by placing a replacement die over the first die and electrically connecting it with traces or pads on the PCB. In yet another embodiment, if the first die fails burn in it can be removed and replaced with a second die such as a known good die. If the die passes burn in and is underfilled, but later fails, a known good die can be attached to the first die (now glob topped) and electrically coupled with the PCB to functionally replace the first die. Using known good die (bare die which have been burned in and tested) prevents the need to burn in a replacement die if a die fails during burn in.

The invention provides a glob top style device but allows a failing die to be physically as well as functionally replaced, thereby reducing space problems associated with conventional glob top devices which cannot be physically replaced. It also provides temporary protection of the die while it is being burned in and tested without the use of glob top.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENT

Figure 1:
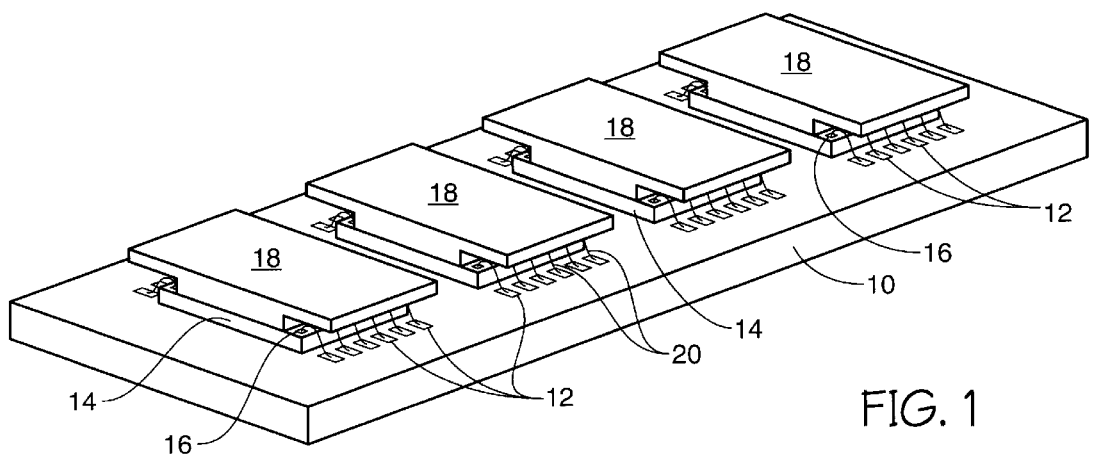
FIG. 1 is an isometric view of a first in-process embodiment of the invention.
Figure 2:
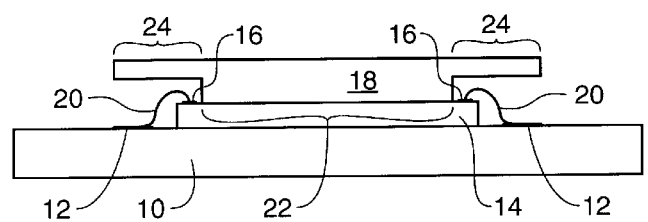
FIG. 2 is a cross section of the structure of FIG. 1.

In accordance with one embodiment of the invention an assembly as shown in FIGS. 1 and 2 is manufactured and includes a support 10 such as a printed circuit board (PCB) having traces or pads 12 thereon, one or more unencapsulated (bare) semiconductor die 14 having terminals 16 such as bond pads thereon attached to the PCB, and a surface plate 18 attached to one or more semiconductor die. The terminals on the die are electrically coupled with the traces or pads on the PCB using means such as bond wires 20, tape automated bonding (TAB, not shown) or another electrical interconnect. The PCB in this embodiment provides electrical rerouting (not shown) of signals to and from the die as well as supporting the die.

In the embodiment of FIGS. 1 and 2, each semiconductor die is removably attached to the printed circuit board using a die attach material (not shown), such as Ablebond 8460 available from Ablestick of California or other workable materials. A layer having a thickness of from about 0.5 mils to about two mils would sufficiently attach the die to the PCB. A cure step may be required to set the die attach material depending on the material. Any material which attaches the die to the PCB should be such that the die can be removed from the PCB without damaging the PCB if the die is later found to be nonfunctional. In addition, the material should be sufficient to allow the die to remain attached to the PCB permanently if the die is later found to be fully functional.

The die in this embodiment comprises a polyimide passivating layer (not shown) covering a circuit side of the die except for the terminals. An adhesive material such as Sumioxy 5120T, for example, available from Sumitomo Durez Co. Ltd. of Japan attaches a surface plate to the die. Other workable materials are available which would sufficiently attach the surface plate to the die. An adhesive layer (not shown) having a thickness of from about two mils to about six mils can be used to attach the surface plate to the die. The adhesive material used should provide a stable, noncorrosive attachment between the die and the surface plate. The surface plate itself can be manufactured from plastic, ceramic, or preferably silicon using a method described later. As shown in FIG. 2, the surface plate has a generally "T" shaped cross section and comprises a first portion attached to the die at a first, center portion 22 of the die and comprises a second portion 24 which extends over the terminals 12 and beyond the edge of the die 14 and leaves the terminals 12 exposed at this point in the manufacturing process. The surface plate 18 protects the bond wires 20 or other electrical interconnect during processing of the assembly. In this embodiment comprising a die with terminals on the ends of the die as shown in FIG. 1, the surface plate 18 is slightly longer at each end than the die which provides greater protection to the bond wires 20, TAB tape, or other electrical interconnect between the die 14 and the PCB 10. The height of the second portion 22 of the surface plate 18 which overlies the electrical interconnect should be adequate to minimize contact between the surface plate 18 and the electrical interconnect 20, especially if bond wires are used, for example so that an improved encapsulation of the bond wires can be provided in later processing steps.

After attachment of the surface plate to the die, the die is tested. The PCB or other support is placed in a test fixture, and the die is electrically stressed and tested according to means known in the art. If a first die is not found to be fully functional, the surface plate and the die are removed from their location on the PCB and a second die is placed at the location on the PCB and electrically connected to the PCB. A surface plate is attached to the replacement die. This second die is tested and replaced if necessary.

Once the die (or each of the plurality of die) is found to be functional the assembly is electrically stressed, heated and/or cooled (burned in), and tested. If a die is found to have failed burn in, it can be removed and replaced with a second die, and the assembly is retested and burned in again.

Thus one advantage of the invention over conventional technology is that the surface plate allows for protection of the die during the initial test for functionality and during burn in, but if the die fails it can be removed and replaced in the same position on the PCB with another die. With conventional glob top assemblies, the glob top is formed prior to initial testing to protect the die, but if the die fails it must be functionally replaced with a second die at another location on the PCB which requires additional space on the PCB. The requirement of using additional PCB space is not desirable, especially in the art of manufacturing portable computers, digital telephones, pagers, and other electronic equipment where size is a concern. Glob top provides permanent protection of the die while the instant invention provides both temporary and permanent protection.

Figure 3:
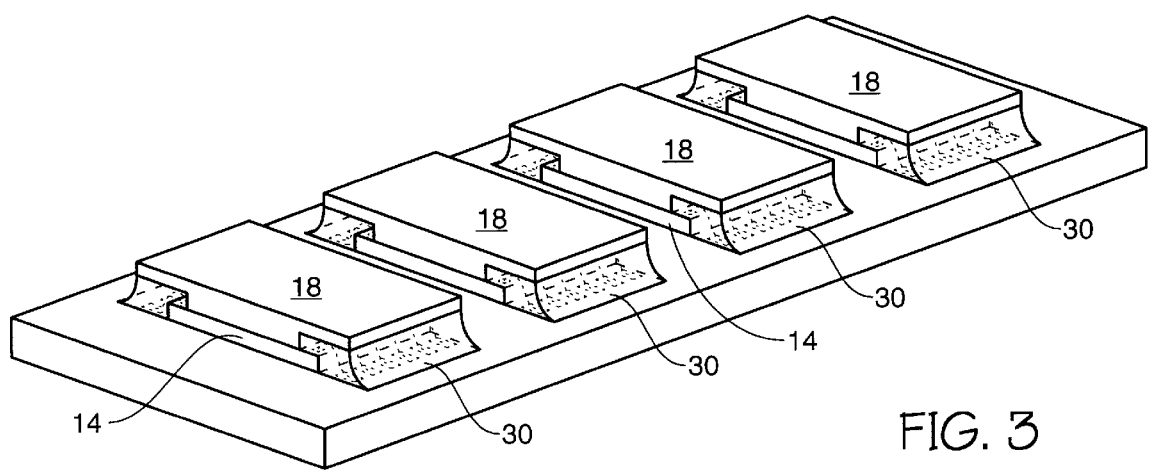
FIG. 3 is an isometric view of the FIG. 1 structure after the addition of Underhill.
Figure 4:
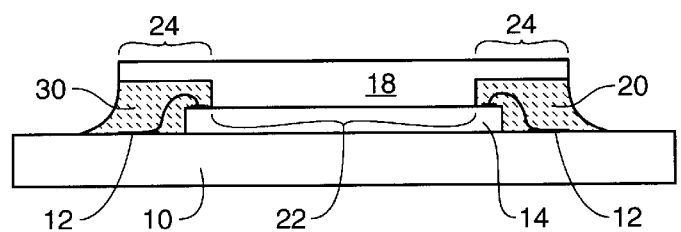
FIG. 4 is a cross section of the structure of FIG. 3.

Once the single die or the plurality of die are all found to be functional after burn in, the electrical interconnects which electrically couple the PCB and the die are sealed as shown in FIGS. 3 and 4. To seal the interconnects a filler 30 such as conventional glob top material is interposed between the die 14 and the surface plate 18 to underfill the second portion 24 of the surface plate 18 which extends over the terminals of the die and, in the embodiment shown, over a portion of the PCB where the interconnect contacts the PCB.

In another embodiment (not shown) the underfill surrounds the die on all four sides to completely seal the die. This includes an option of providing a surface plate with an overhang on all four sides.

An underfill or glob top material such as 4450 Hysol by Dexter Electronics, 2111 Tracon by Tracon Co., or Ablebond products by Ablestick would function adequately. The underfill material can be applied by any workable means such as by dispensing the material with a syringe, or by other specific molded openings configured for easy underfill. A secondary function of the underfill in addition to protecting the die and electrical interconnect from environmental damage is to adhere the die 14, surface plate 18, and support 10 together. Using this arrangement the die and surface plate are attached using a first adhesive (not shown) having a first thickness and also using a second adhesive 30 (the underfill) having a second thickness, with the second thickness being substantially thicker than the first thickness.

In this embodiment for manufacturing the assembly a fense which is typically used with glob top processing is not required as the surface plate provides sufficient surface tension to hold the glob top material in place while it is cured as long as the viscosity of the uncured material is sufficiently high. Omitting the fence has the advantage of reduced processing steps and conservation of space on the PCB. After the electrical interconnect is sealed with the underfill, the assembly can be tested once again to ensure the integrity of the electrical interconnect between the PCB and each die.

Figure 5:
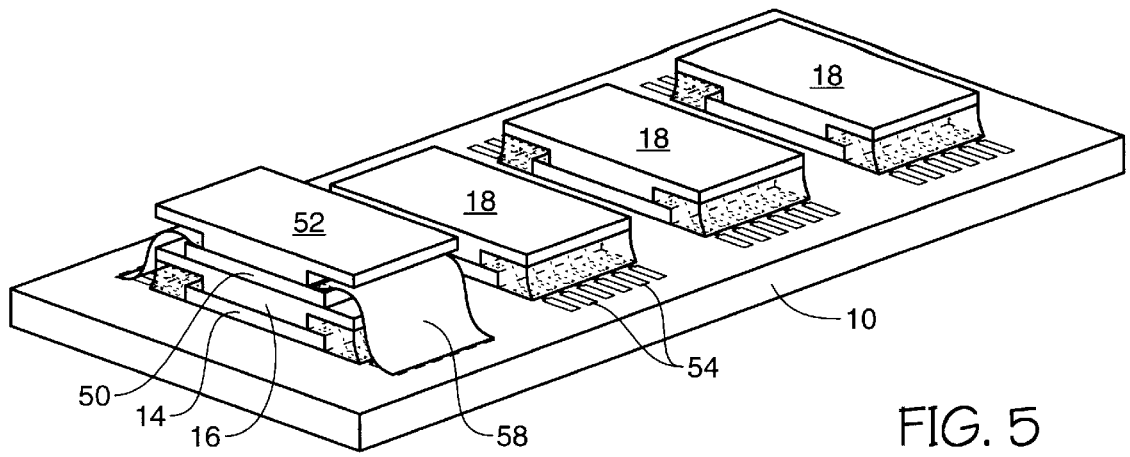
FIG. 5 is an isometric view showing replacement of a first nonfunctional die with a second die overlying the first die.
Figure 6:
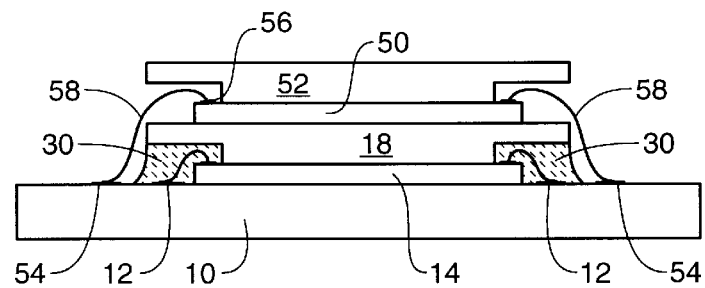
FIG. 6 is a cross section of the FIG. 5 structure.

If one or more die fails after underfilling, a second die can be used to replace the failing underfilled die-surface plate assembly. As the underfill has been added to contact the terminals of the first die and to contact the PCB, as well as contacting the surface plate, the first die is not easily removed without damaging the PCB including the traces or pads on the PCB once it has been underfilled. Therefore, in this embodiment, a second die 50 is attached to the upper surface of the first surface plate 18 as shown in FIGS. 5 and 6, for example using standard adhesives such as those mentioned earlier, and a second surface plate is attached to the second die 50. After attaching the second die to the first surface plate, or preferably before attaching the second die to the first surface plate, the electrical interconnect between the first die and the PCB must be disconnected to prevent interference of the second die by the first die. For example, the traces can be severed external to the underfill of the first die using a high density laser. The traces can also be severed mechanically. Alternately, separate pads 54 may be used to connect the second die 50 to the PCB 10 than were used to connect the first die, and a jumper (not shown) or other arrangement can be used to select which pads are activated.

After electrically disconnecting the first die from the PCB the terminals 56 of the second die 50 are electrically coupled to the PCB using an electrical interconnect such as bond wires or, preferably, TAB tape 58. Placing the second die over the first die saves space on the PCB by using vertical space which requires using no additional lateral space.

Alternately, the first die can be functionally replaced using a die in another location directly on the PCB rather than placing the replacement die over the failing die.

Figure 7:
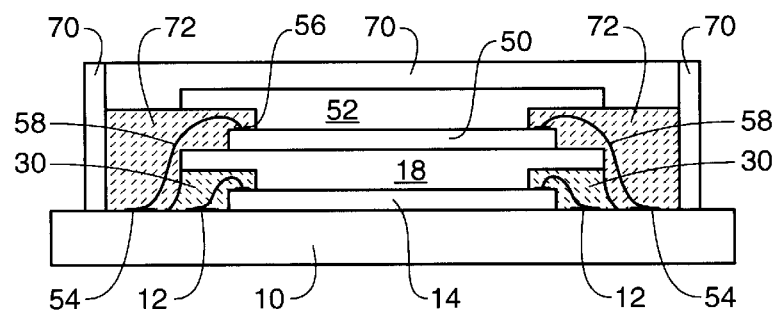
FIG. 7 is a cross section of an in-process assembly using a fence to form underfill material around the assembly.

Next, the second die 50 can be tested and burned in and, if it fails, the second die and second surface plate can be removed and replaced. If the second die passes, underfill material is dispensed between the second surface plate and the second die, and also to the PCB, to seal the electrical interconnect according to the means described above. The length of the portion of the second surface plate which extends over the PCB can be longer than the portion of the first surface plate which extends over the PCB to allow the electrical interconnect to be completely sealed in underfill material. Alternately, a fence 70 (referring to FIG. 7) can be formed around the stack comprising the first and second die and first and second surface plates, then underfill material 72 can be dispensed within the fence to seal the stack and the second interconnect 58. The formation of fences is known in the art of glob top manufacture.

After underfilling the second die in a similar manner as described for the first die and shown in FIGS. 3 and 4, if the second die fails it can be functionally replaced with a third die stacked over the second die or by a third die replaced at another location on the PCB. Practically, there is a finite number of devices that can be stacked until the stack becomes unstable or excessively thick.

If the first device that has been underfilled fails, an alternate embodiment is to stack a known good unpackaged die (a bare die that has been tested and burned in) over the first die or placed at another location on the PCB. The known good die is then electrically connected with the PCB and underfilled. The use of a surface plate with a known good die may not be required since it is a fully tested and burned in die which is not prone to failures. Omitting the surface plate would decrease the thickness and cost of the assembly. A surface plate may be used, however, to better protect the known good die during processing of the apparatus. Using a known good die may be somewhat more expensive than using an untested die, but may become advantageous when factoring in the resulting reduction in time and materials required when reworking the PCB.

Figure 8:
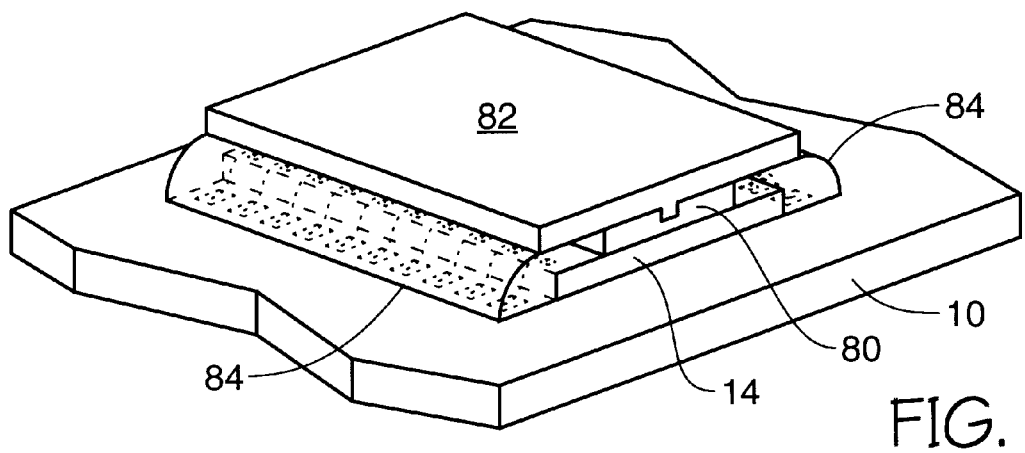
FIG. 8 is an isometric view showing an embodiment of the invention comprising a surface plate having two segments.
Figure 9:
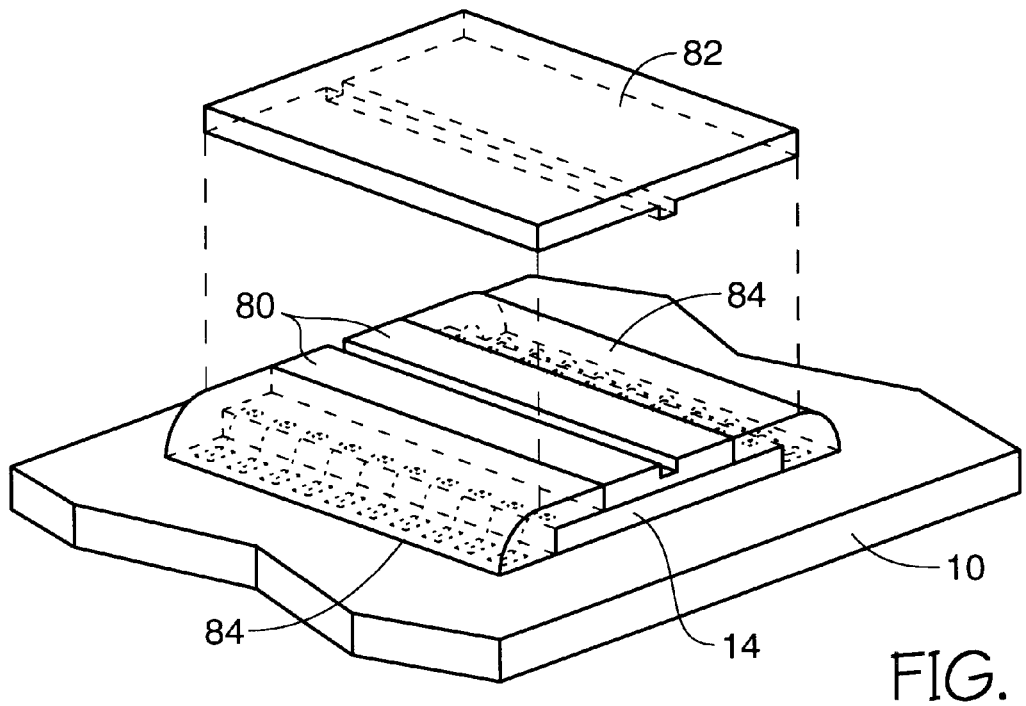
FIG. 9 is an exploded view of the FIG. 8 structure after removal of one of the two segments.

FIGS. 8–9 show another inventive embodiment of the invention using a surface plate having a first segment 80 and a second segment 82 adapted to separate from the first segment. In this embodiment the second segment snap fits to the first segment, although other attachment means will become apparent to one of skill in the art from the description herein. The assembly using this embodiment of the surface plate is manufactured up to the point shown in FIG. 8, including the underfill 84. The second segment 82 functions as a form for the underfill. After the underfill cures the second segment is removed from the first segment as shown in FIG. 9. If the die shown fails, a second die can be placed directly on top of the underfill. Using a two piece assembly allows for a reduced thickness of the device and may be advantageous for some uses such as portable computers or other assemblies where space is a concern.

Figure 10:
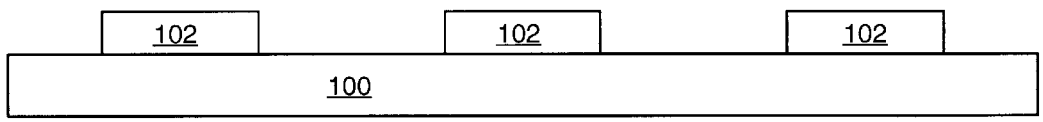
FIGS. 10–12 are cross sections showing three steps in the formation of surface plates from a silicon wafer.
Figure 11:
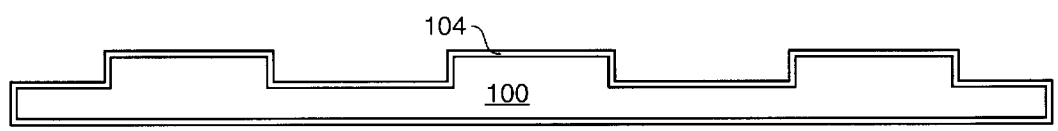
Figure 12:
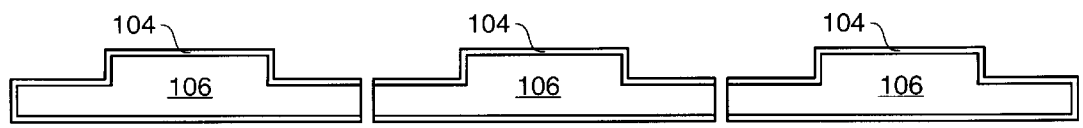

FIGS. 10–12 show one method of forming a surface plate from silicon such as a silicon wafer. As shown in FIG. 10 a silicon wafer 100 is masked, for example with photoresist 102, then an anisotropic etch is performed. The photoresist is removed and, optionally, a dielectric layer 104 such as oxide, nitride, or a combination thereof is formed over the surface of the etched wafer as shown in FIG. 11. Next, the silicon is separated between the formerly masked areas as shown in FIG. 12, for example using a wafer saw or masking and etching the wafer, to form a plurality of surface plates 106. Using this process a large number of surface plates can be manufactured simultaneously and inexpensively. The cross section of FIGS. 10–12 show the manufacture of three surface plates, however it is likely that one hundred or more surface plates would be manufactured simultaneously. In addition to being cost effective, surface plates manufactured from silicon would also have the advantage of a matched coefficient of thermal expansion with the silicon of the die to which it will be attached. Thermal matching reduces failures of the die resulting from uneven expansion during thermal cycling.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for forming a semiconductor assembly comprising the following steps:

attaching an unencapsulated semiconductor die having terminals thereon to a support;

electrically coupling said die with said support;

placing a surface plate in contact with said die and leaving exposed said terminals;

testing said semiconductor die with said terminals exposed.

2. The method of claim 1 wherein said surface plate contacts said die during said step of testing.

3. The method of claim 1 further comprising the following steps:

determining that said die passes said test and passing said die in response to said test;

responsive to said die passing said test, placing a filler between said die and said surface plate thereby encapsulating an electrical interconnect which electrically couples said die with said support.

4. The method of claim 3 wherein said filler contacts at least two of said support, said die, and said surface plate.

5. The method of claim 3 wherein said electrical interconnect comprises bond wires.

6. The method of claim 3 wherein said electrical interconnect includes tape automated bonding.

7. The method of claim 1 further comprising the following steps:

attaching said surface plate to said die with a first adhesive having a first thickness and with a second adhesive having a second thickness wherein said second thickness is substantially thicker than said first thickness.

8. The method of claim 1 wherein said die is a first die and is attached to said support at a first location, further comprising the following steps:

determining that said first die fails said test and failing said first die in response to said test;

removing said first die from said first location;

attaching a second semiconductor die having terminals thereon to said support at said first location;

electrically coupling said second die and said support;

placing a surface plate in contact with said second die;

burning in then testing said second die;

responsive to said second die passing said test, placing a filler between said second die and a surface plate attached to said second die thereby encapsulating wires which electrically couple said second die with said support.

9. A method used during the formation of an electronic device comprising the following steps:

providing at least first and second unpackaged semiconductor die;

providing a support;

mechanically attaching said first unpackaged die to said support;

electrically coupling said first unpackaged die to said support;

testing said first unpackaged die; and responsive to said first unpackaged die failing said test, mechanically coupling said second unpackaged die with said first die.

10. The method of claim 9 further comprising the following steps:

providing a surface plate having first and second portions;

attaching said first portion of said surface plate to said first die wherein said second portion of said surface plate overhangs bond pads of said first unpackaged die such that said second portion of said surface plate and said bond pads have a space therebetween; and providing a filler material to fill said space between said second portion of said surface plate and said bond pads of said first unpackaged die.

11. The method of claim 10 wherein said step of providing said filler material comprises the step of contacting said surface plate, said unpackaged first die, and said support with said filler material.

12. The method of claim 10 wherein said step of mechanically coupling said second unpackaged die with said first unpackaged die comprises the step of attaching said second unpackaged die to said surface plate.

13. The method of claim 9 further comprising the step of electrically uncoupling said first unpackaged die such that said first unpackaged die provides no electrical signal to said support during electrical operation of said support.

14. A method used during the formation of an electronic device comprising the following steps:

providing at least one unpackaged semiconductor die having a circuit side with conductive pads thereon;

providing a support;

mechanically attaching said unpackaged die to said support;

electrically coupling said unpackaged die to said support;

attaching a first portion of a surface plate to said circuit side of said die wherein a second portion of said surface plate overhangs said conductive pads such that said second portion of said surface plate and said pads have a space therebetween;

subsequent to electrically coupling said die to said support, testing said unpackaged die; and responsive to said unpackaged die passing said test, providing a filler material to fill said space between said second portion of said surface plate and said pads of said unpackage die.

15. The method of claim 14 wherein said step of providing said filler comprises contacting said die, said surface plate, and said support with said filler.

16. The method of claim 14 wherein said step of electrically coupling said die with said support comprises the step of forming bond wires between said conductive pads on said die and pads on said support.

17. A method of forming a semiconductor device comprising the following steps:

providing at least first and second unpackaged semiconductor wafer sections;

providing a support for said unpackaged wafer sections;

attaching said first semiconductor wafer section to said support;

testing said first semiconductor wafer section; and responsive to said first semiconductor wafer section failing said test, mechanically coupling said second wafer section with said first wafer section, wherein at least a portion of said first wafer section is interposed between said support and said second wafer section and wherein said first wafer section provides no electrical signal to said support during electrical operation of said support.

18. The method of claim 17 wherein said step of providing said support includes providing a printed circuit board, and wherein said method further comprises the following steps:

electrically coupling said first wafer section with said printed circuit board;

electrically decoupling said first wafer section such that said first wafer section provides no electrical signal to said support during electrical operation of said support; and electrically coupling said second wafer section with said printed circuit board.

19. The method of claim 18 wherein said step of electrically decoupling said first wafer. section comprises the step of adjusting a jumper.

20. Of The method of claim 18 wherein said step of electrically coupling said first wafer section with said printed circuit board comprises the step of wire bonding said first wafer section with said printed circuit board, and wherein said step of electrically coupling said second wafer section with said printed circuit board includes tape automated bonding of said second wafer section and said printed circuit board.

* * * * *